United States Patent [19]

Troxell et al.

[11] Patent Number: 4,851,363
[45] Date of Patent: Jul. 25, 1989

[54] FABRICATION OF POLYSILICON FETS ON ALKALINE EARTH ALUMINO-SILICATE GLASSES

[75] Inventors: John R. Troxell, Sterling Heights; Marie I. Harrington, Troy; James C. Erskine, Birmingham, all of Mich.

[73] Assignee: General Motors Corporation, Detroit, Mich.

[21] Appl. No.: 171,355

[22] Filed: Mar. 21, 1988

Related U.S. Application Data

[60] Division of Ser. No. 884,783, Jul. 11, 1986, abandoned, which is a continuation-in-part of Ser. No. 860,521, May 7, 1986, abandoned.

[51] Int. Cl.[4] .................. H01L 21/316; H01L 21/318; H01L 21/84; H01L 21/95
[52] U.S. Cl. ...................................... 437/40; 437/978; 437/239; 357/23.7
[58] Field of Search ...................... 437/40, 41, 12, 238, 437/241, 978, 239; 357/23.7; 148/DIG. 152

[56] References Cited

U.S. PATENT DOCUMENTS 4,634,684  1/1987  Dumbaugh, Jr. ...................... 501/69

FOREIGN PATENT DOCUMENTS 58-164268  9/1983  Japan .................................. 357/23.7

OTHER PUBLICATIONS

Morozumi et al., SID '82, Symp. Digest, 156.
Lakatos, Int. Display Res. Conf. (IEEE, New York, NY, 1982), 146.
Shichijo et al., Mat. Res. Soc. Symp. Proc. 33, 193, (1984).
Onga et al., Jpn. J. Appl. Phys. 21, 1472, (1982).
Powell, Mat. Res. Soc. Symp. Proc. 33, 259, (1984).
Possin et al., IEEE Tr. Elec. Dev. Ed—31, 68 (1984).
Matsui et al., J. Appl. Phys. 55, 1590(1984).
Juliana et al., SID '82 Symp. Digest, 38.
Oana et al., SID '84, Digest, pp. 312-315.
Singh et al., IEDM Tech. Dig. 67-69, (1983).
Pollack et al. IEEE Elect. Div. Lett., EDL—5, 468-470, (1984).
Dalton et al., J. Electrochem. Soc. 115, pp. 865-868, (1968).
Burgess et al., J. Electrochem. Soc., 116, pp. 1005-1008, (1969).
Petritz, Phys. Rev. 104, pp. 1508-1516, (1956).
Ghandhi, *VLSI Fabrication Principles*, John Wiley and Sons, Inc., (New York, NY), 1983, p. 427.

Primary Examiner—Olik Chaudhuri
Attorney, Agent, or Firm—Domenica N. S. Hartman

[57] ABSTRACT

A method of fabricating polycrystalline silicon thin film field effect transistors on low cost alkaline earth alumino-silicate glass substrates which can tolerate device processing temperatures of approximately 800° C.

4 Claims, 1 Drawing Sheet

FABRICATION OF POLYSILICON FETS ON ALKALINE EARTH ALUMINO-SILICATE GLASSES

This application is a divisional of U.S. Pat. application Ser. No. 884,783, that was filed on July 11, 1986, now abandoned, which was a continuation-in-part of our United States patent application Ser. No. 860,521, that was filed May 7, 1986, entitled "Fabrication of Polysilicon FETs on Alkaline Earth Alumino-Silicate Glasses", now abandoned.

INTRODUCTION

This invention relates to thin film transistors, to methods of fabricating thin film transistors and particularly to a method of manufacturing thin film transistors on an economical alkaline earth alumino-silicate glass substrate having the capability of withstanding transistor manufacturing process steps at temperatures of at least about 800°c.

BACKGROUND OF THE INVENTION

It is known to manufacture polycrystalline silicon transistors in large area arrays on transparent crystalline substrates such as quartz. The quartz substrate is capable of withstanding thin film transistor processing steps at temperatures of about 800°C. or higher but is also very expensive.

One approach to the reduction of substrate cost is to use a less expensive glass but this simultaneously requires a substantial reduction in processing temperatures and the use of new materials such as hydrogen doped amorphous silicon. Along with this reduction in processing temperatures comes a reduction in the yield of the fabrication process and the gains realized through a reduction in the substrate costs are at least partially offset.

SUMMARY OF THE INVENTION

A primary objective of the present invention is to provide a method of manufacturing thin film transistors at low cost and, if desired, transparent glass substrates, which are capable of withstanding transistor manufacturing process steps at temperatures of at least about 800°C. thereby to realize high production yields. In general the objective of the invention is achieved through the use of a substrate of alkaline earth aluminosilicate glass and the processing steps of (a) forming a transistor backside interface layer on the glass substrate, (b) forming discrete islands of polycrystalline silicon on the interface layer, (c) forming oxide elements on the islands through thermal oxidation at temperatures of at least about 800°C. in part to serve as the active gate dielectric layer, (d) depositing and patterning a second polysilicon layer, to serve as the transistor gate, and (e) doping the source, drain and gate regions by ion implantation.

Other transistor fabrication process steps such as the formation of blanket layers of certain materials and the subsequent steps of etching said materials to remove portions thereof, as well as the step of forming appropriate electrical conductors are also employed as will be apparent to those skilled in the art. It will also be apparent to those skilled in the art that the use of a polysilicon self-aligned gate process is desirable but not required.

In the preferred embodiment the akaline earth alumino-silicate glass substrate is prepared first by forming an ionic barrier layer of a material such as silicon nitride on both surfaces of the glass thereby to prevent impurities in the glass from migrating into and otherwise affecting the thin film transistors.

Details of the method of the present invention will be best understood from a reading of the following description of an illustrative embodiment.

DETAILED DESCRIPTION OF THE SPECIFIC EMBODIMENT

Figure 1:
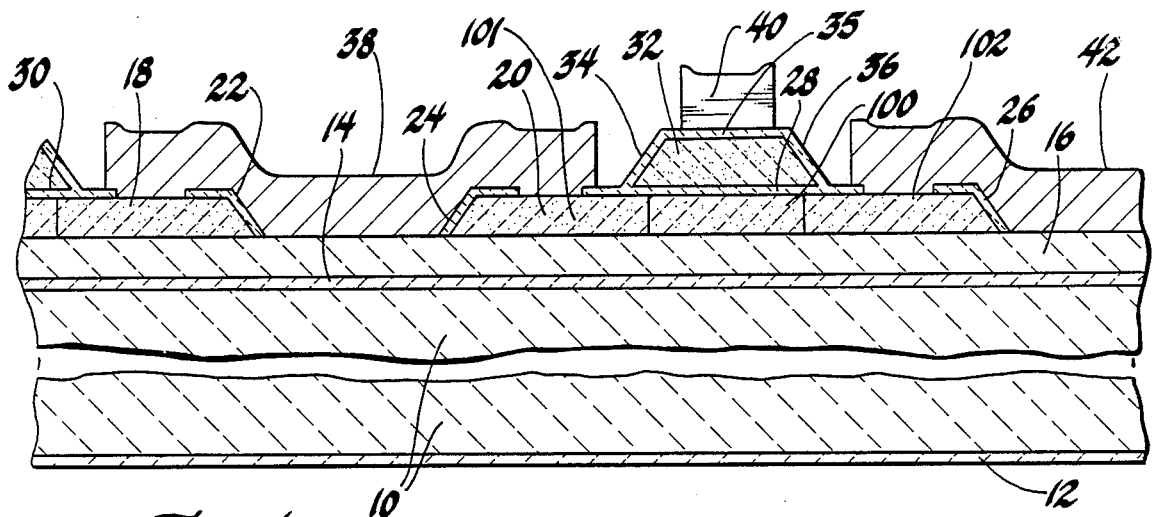
FIG. 1 is a cross sectional view of a substrate with finished transistors formed thereon according to the present invention.

Referring to FIG. 1 a description of the resulting transistor and substrate combination together with a generalized description in summary form of the fabrication process will be given. In FIG. 1 the thin film transistor composite comprises an alkaline earth aluminosilicate glass substrate 10 which is inexpensive to fabricate and capable of withstanding device processing temperatures of at least about 800°C. without warpage or chemical attack. The composite further comprises layers 12 and 14 of silicon nitride ($Si_3N_4$) deposited on both upper and lower parallel surfaces of the substrate 10 to act as an ionic impurities barrier. The composite further comprises, deposited over silicon nitride layer 14, a silicon dioxide layer 16 which acts as a backside interface layer for the transistors to be formed thereon. This layer also serves to prevent dopant atoms from reaching the silicon nitride layer and rendering it conductive.

Over the silicon dioxide layer 16 the composite structure of FIG. 1 is shown to comprise a plurality of polycrystalline silicon islands 18 and 20 in spaced relationship. In fact these islands are formed by depositing a blanket of polycrystalline silicon at about 650°C. by atmospheric and/or low pressure chemical vapor deposition. The blanket layer is thereafter etched to define the islands 18 and 20, it being understood by those skilled in the art that many additional islands are also formed on the substrate in the plane of the drawing as well as in the plane normal thereto for economy of manufacture.

After the islands 18 and 20 are defined the, silicon dioxide portions 22, 24, 26, 28 and 30 are formed by thermal growth at temperatures of at least about 800°C. at which temperatures of such oxide layer growth is reliable and sufficiently rapid to be practical. The silicon dioxide is preferably formed on the islands by thermal oxidation. Contact holes are subsequently opened in it. The quality of the oxide is important because it serves as the gate dielectric for the completed transistor. The preferred embodiment involves the growth of the oxide in a wet ambient, one containing water vapor, as known by those skilled in the art. Oxidation that is performed in a dry ambient requires much longer time and does not yield improved performance. It therefore can be used but is not preferred.

In the fabrication of the thin film transistors, an ion implant by shower like bombardment takes place at this time. The ionic shower may comprise a blanket implant of such well known doping ions as arsenic, antimony, boron or phosphorus and these ions enter the transistor substrate or channel region and dope these regions either P-type or N-type depending upon the type of transistor being fabricated. In the present embodiment we implant boron in order to fabricate N-channel enhancement transistors. In the example shown in FIG. 1, an elongated, bar-like polycrystalline silicon gate electrode 32 is thereafter formed above the oxide portion 28. It is photolithographically defined from a blanket polycrystalline silicon layer deposited after the ion shower. Additional silicon oxide portions 34, 35 and 36 are formed through thermal oxidation at temperatures of at least about 800°C.. to completely coat the polycrystalline silicon bar 32.

The source 101 and drain 102 regions are then formed by introducing a dopant, which is phosphorus in the present example. In this example, the phosphorus atoms are introduced by ion implantation. It should be understood by those knowledgeable in the field that other means of dopant introduction, solid state diffusion from a deposited source for example, are equally appropriate. In fact, such an alternative doping process may be the preferred process.

The type of dopant introduced is chosen in order to fabricate a specific type of transistor. The example given here produces an N-channel enhancement mode transistor, but the use of other combinations of N and P-type dopants in the channel 100, and source and drain regions 101 and 102 could be employed to fabricate accumulation mode or depletion mode transistors in the same manner as described herein.

The final structural step is to form the aluminum conductors 38, 40 and 42 which in the example of FIG. 1 comprise electrical contacts to source and drain regions 101 and 102 and to gate electrode 32. Conductor 40 is not shown as making direct (i.e., electrical) contact to the polysilicon gate electrode 32 over the channel 100. Ordinarily such contact is made between them at another location on substrate 10.

Figure 2:
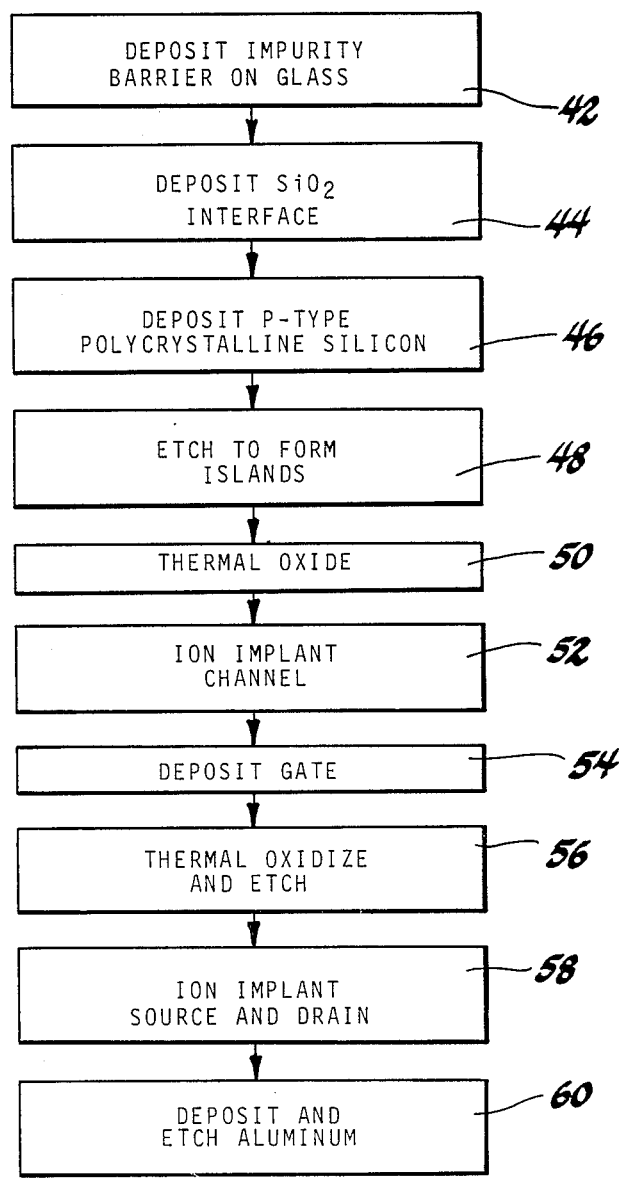
FIG. 2 is a flow chart of the process steps carried out in the course of manufacturing the transistors shown in FIG. 1.

The process steps are essentially defined in the flow chart of FIG. 2. Step 42 essentially involves the formation of the impurity barrier layers 12 and 14 on the alkaline earth alumino-silicate glass substrate 10. Step 44 represents the deposition of the transistor interface backing layer 16 and step 46 represents the deposition of the polycrystalline silicon in blanket form on the layer 16. Step 48 represents the etching of the polycrystalline silicon to define the islands 18 and 20.

Step 50 represents the thermal oxidation step which is highly desirable for forming the oxide portions 22, 24, 26 and 28 on the polycrystalline islands thereby to act as dielectric insulators which cover the source, gate and drain regions 101, 100 and 102 as will be apparent to those skilled in the art.

Step 52 is the channel doping step which in this case is carried out by ionic bombardment.

Step 54 represents the deposition of a second polycrystalline silicon layer and delineation of a gate electrode on the central area of the polycrystalline island 20. Step 56 represents the formation, through thermal oxidation and etching, of the discrete oxide layers 34 and 36 over the new deposit of polycrystalline silicon gate layer 32. Step 58 represents the doping, by ion implantation in the illustrative example, of the source, drain and polycrystalline silicon gate regions, rendering them conductive. Finally, step 60 represents the deposition and etching of the aluminum conductors 38, 40 and 42.

The following description refers to and describes a specific and illustrative utilization of the inventive process and defines numerous materials and process steps in great detail. It is to be appreciated that the utilization of the invention may involve substantial departures from a number of the aspects described in detail in this section.

The preferred glass from which to fabricate substrate 10 is identified as Corning code number 1729 glass. This glass is alumino-silicate of the type described in U.S. Pat. No. 4,180,618 issued Dec. 25, 1979 to James W. Alpha and William H. Dumbaugh, Jr. and the disclosure of that patent is incorporated herein by reference. The alkaline earth alumino-silicate glass described in that patent is essentially alkali free, has a high resistivity, has a linear thermal expansion coefficient which substantially matches that of silicon, is inert to etchants, has a strain point at or above 800°C. and is able to minimize autodoping of the silicon. The glassy network is composed of silica with interspersed alumina. The alkaline earths compensate for the missing charge on the aluminum ions so that they can be four-coordinated when substituted for silicon ions in the network. In addition the alkaline earths serve as modifiers breaking up the network and lowering the melting point of the alumino-silicate backbone. The coefficient of thermal expansion of the glass is approximately $37 \times 10^{-7}°C.^{-1}$; values in the range of 32 to $42 \times 10^{-7}°C.^{-1}$ are considered acceptable.

Formation of high temperature glasses into sheet form can be done by rolling followed by grinding and polishing. The glass substrates used in the foregoing description were prepared that way. However this is inherently more expensive than an overflow pipe process developed by Corning Glass Works; see D.C. Boyd and D.A. Thompson in Kirk-Othmer: Encyclopedia of Chemical Technology, volume 11, 3rd edition, John Wiley and Sons, New York, 1980, p. 863. In the overflow process, molten glass flows into a trough. The glass overflows the sides of the trough running down to fuse together at the root of the trough. The sheet is pulled downwardly, annealed, and cut into pieces, which do not require grinding and polishing. The Corning Code 1729 glass should be formable in this method, which would significantly reduce its cost.

The final glass sheets are cut into slices which are then ground and polished to 1.0 mm thickness. The strain point, defined as the temperature at which stress in the glass can be relieved in about four hours is about 800°C. The annealing point, the temperature at which it takes about 15 minutes to relieve the stress, is approximately 855°C.

Glass substrates with 30° beveled edges are preferably used in the fabrication of the polysilicon thin film transistors. Particulate contamination is removed by using a high pressure deionized water rinse and subsequent nitrogen gas drying. Organic and inorganic contamination can be removed using a solvent degrease and RCA Cleaning; see W. Kern and D.A. Puotinen, RCA Review, 31, 187 (1970). To isolate any ionic contaminants in the glass from the processing equipment and the active device regions a silicon nitride layer 12, 14 is deposited on both sides of the substrate 10 by plasma assisted chemical vapor deposition. A silicon ion implantation step, $1 \times 10^{16} cm^{-2}$, 170 keV, is used to drive off excess hydrogen in the film. This step is followed by a five hour annealing step at 800°C. in nitrogen to allow for glass shrinkage prior to the first photolithography step. A 1000 nm silicon dioxide buffer layer 16 is then deposited using atmospheric pressure chemical vapor deposition. This thick oxide layer masks the nitride from subsequent dopant implants and maintains electrical isolation from one device to another. A 500 nm thick blanket layer of polysilicon is then deposited at 650° C. by atmospheric pressure chemical vapor deposition. In some samples the oxide-polysilicon interface was doped by boron, typically $5 \times 10^{12} cm^{-2}$, 190 keV, to prevent this surface from inverting. The polysilicon islands 18, 20 are defined by etching. A gate oxide is grown over the islands 18 and 20 using normal and accepted wet oxidation MOS processing techniques at temperatures of at least about 700°C. and preferably at least about 800°C. A 100 nm thermally grown gate oxide with a 500 nm polysilicon gate 32 is preferred. The channel is implanted with boron, typically $2 \times 10^{11} cm^{-2}$, 45 keV. Phosphorus, $5 \times 10^{15} cm^{-2}$, is implanted to form the source and drain regions and dope the polysilicon gate electrode 32. Contact holes are then opened, and aluminum at a thickness of 1000 nm is then deposited by electron beam evaporation to form conductors 38, 40 and 42. The aluminum contacts are sintered at 440°C. for 30 minutes in forming gas. A hydrogen implant, $5 \times 10^{15} cm^{-2}$, 70 keV, followed by an annealing step at 410°C. in forming gas is used to passivate the polysilicon grain boundaries thereby to suppress carrier trapping and reduce the transistor threshold voltage.

The performance of these devices demonstrates that the fabrication of polycrystalline silicon thin film transistors on low cost glass substrates is a viable alternative to amorphous silicon devices. With small device geometries and adequate on-to-off current ratio and leakage currents, these devices can serve as pixel control switches in liquid crystal displays. In addition, the insensitivity of these devices to illumination offers a significant practical advantage in implementing these active devices in the high light ambient liquid crystal display application. This is in marked contrast to the need for complex light blocking arrangements when amorphous silicon devices are used for display addressing applications. The high temperature capability and superior chemical resistance of the glass substrates allow one to fabricate these transistors using integrated circuit processing technology. A particular advantage of this technology is the use of thermally grown silicon dioxide for the gate dielectric, removing the potential reliability and stability concerns associated with the use of deposited gate insulators by competing technologies such as amorphous silicon. Finally, the use of a polysilicon transistor pixel control technology opens the door for a relatively simple extension of device processing to incorporate both row and column driver transistors. Such an extension is at present not possible with amorphous silicon technology.

The embodiments of the invention in which an exclusive property or privilege is claimed are defined as follows:

1. A method of making thin film transistors comprising the steps of:
    (a) preparing a substrate of alkaline earth alumino-silicate glass;
    (b) depositing an ionic barrier layer of silicon nitride on a surface of said substrate;
    (c) forming a dopant barrier layer of silicon dioxide on a surface of said ionic barrier layer;
    (d) forming discrete islands of polycrystalline silicon on said dopant barrier layer;
    (e) forming oxide elements on said islands through thermal oxidation at temperatures of at least about 800°C. to form gate insulator regions on each of said polycrystalline silicon islands; and thereafter
    (f) doping said polycrystalline silicon islands with ions to dope the source and drain regions.

2. The method of claim 1 wherein said glass substrate is transparent.

3. The method of claim 1 including the further step of forming a polycrystalline silicon gate on an oxide element over a gate region of each of said islands and thereafter forming through thermal oxidation at temperatures of at least 800°C an additional oxide element over said polycrystalline gate.

4. The method of claim 1 including the further step of forming conductive metallic layers on and in electrical connection with the source, gate and drain regions.

* * * * *